(12) United States Patent
Toft

(10) Patent No.: US 12,095,390 B2
(45) Date of Patent: Sep. 17, 2024

(54) APPARATUS AND METHOD FOR APPLYING A BIAS VOLTAGE TO A MEMS DEVICE BASED ON A VARIABLE REFERENCE SIGNAL

(71) Applicant: Knowles Electronics, LLC, Itasca, IL (US)

(72) Inventor: Jakob Kenn Toft, København (DK)

(73) Assignee: Knowles Electronics, LLC, Itasca, IL (US)

( * ) Notice: Subject to any disclaimer, the term of this patent is extended or adjusted under 35 U.S.C. 154(b) by 209 days.

(21) Appl. No.: 17/959,310

(22) Filed: Oct. 4, 2022

(65) Prior Publication Data

US 2023/0113827 A1    Apr. 13, 2023

Related U.S. Application Data

(60) Provisional application No. 63/253,906, filed on Oct. 8, 2021.

(51) Int. Cl.
*H02N 2/00* (2006.01)
*H02M 3/06* (2006.01)

(52) U.S. Cl.
CPC ............ *H02N 2/0075* (2013.01); *H02M 3/06* (2013.01); *H02N 2/005* (2013.01)

(58) Field of Classification Search
CPC ....... H02N 2/0075; H02N 2/005; H02M 3/06; H02M 3/07; H02M 1/0045; H02M 1/0012; H02M 1/0025; H02M 1/007; H02M 1/15; H10N 30/802; H04R 3/007; H04R 19/02; H04R 19/005; H04R 19/04
See application file for complete search history.

(56) References Cited

U.S. PATENT DOCUMENTS

| | | | |
|---|---|---|---|
| 7,773,016 B2 | 8/2010 | Miao | |
| 10,349,170 B2 * | 7/2019 | Harney | ................. B81B 3/0013 |
| 10,887,712 B2 | 1/2021 | Berthelsen et al. | |

OTHER PUBLICATIONS

Mohammadi et al., U.S. Appl. No. 17/139,743, U.S. Patent and Trademark Office, Dec. 31, 2020.

* cited by examiner

*Primary Examiner* — Emily P Pham
(74) *Attorney, Agent, or Firm* — Loppnow & Chapa; Matthew C. Loppnow

(57) ABSTRACT

A PM signal generator can generate a variable PM signal based on a position of a movable element of a MEMS motor. A bias voltage generator can provide a bias voltage to the MEMS motor. The bias voltage generator can include a reference signal generator that can generate a reference signal that varies based on variation of pulses of the PM signal. The bias voltage can be based on the reference signal.

20 Claims, 11 Drawing Sheets

US 12,095,390 B2

APPARATUS AND METHOD FOR APPLYING A BIAS VOLTAGE TO A MEMS DEVICE BASED ON A VARIABLE REFERENCE SIGNAL

BACKGROUND

1. Field

The present disclosure is directed to microelectromechanical systems (MEMS) devices. More particularly, the present disclosure is directed to an apparatus and method for applying a bias voltage to a MEMS device based on a variable reference signal.

2. Introduction

Presently, consumer electronic devices like mobile phones, personal computers, smart speakers, hearing aids, and True Wireless Stereo (TWS) earphones among other host devices commonly incorporate one or more small microphones, sensors, and/or actuators. Advancements in micro and nanofabrication technologies have led to the development of MEMS devices, such as microphones, sensors, and actuators, having progressively smaller size and different form-factors.

BRIEF DESCRIPTION OF THE DRAWINGS

In order to describe the manner in which advantages and features of the disclosure can be obtained, a description of the disclosure is rendered by reference to specific embodiments thereof which are illustrated in the appended drawings. These drawings depict only example embodiments of the disclosure and are not therefore considered to limit its scope. The drawings may have been simplified for clarity and are not necessarily drawn to scale.

DETAILED DESCRIPTION

Figure 1:
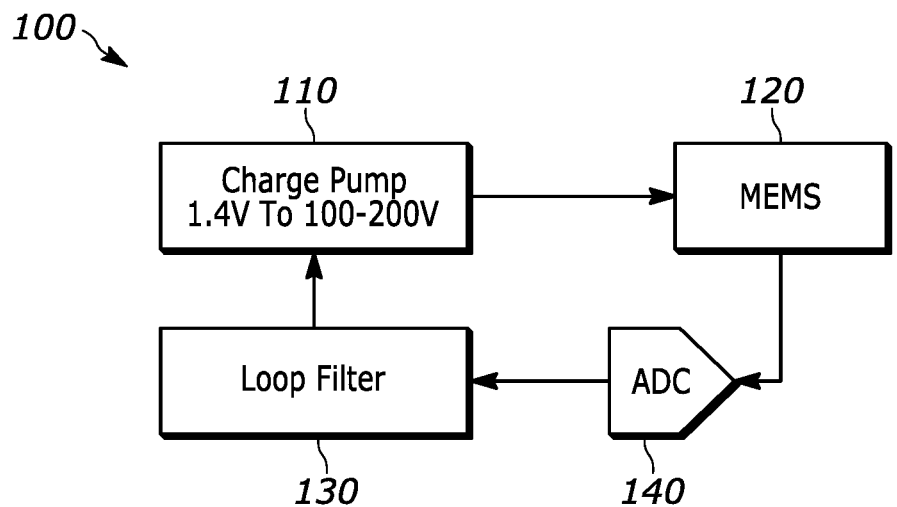
FIG. 1 is an example MEMS system according to a possible embodiment.

At least some embodiments can provide an apparatus and method for applying a bias voltage to a MEMS device based on a variable reference signal. According to a possible embodiment, a Pulse Modulation (PM) signal generator can generate a variable PM signal based on a position of a movable element of a MEMS motor. A bias voltage generator can provide a bias voltage to the MEMS motor. The bias voltage generator can include a reference signal generator that can generate a reference signal that varies based on variation of pulses of the PM signal. The bias voltage can be based on the reference signal. At least some embodiments can provide for a high voltage bias generation circuit with an adjustable output voltage. At least some embodiments can provide digital control of an output voltage.

Any type of pulse modulation can be used in all embodiments. For example, PM can apply to PNM, Pulse Density Modulation (PDM), Pulse Width Modulation (PWM), digital PWM, Pulse Amplitude Modulation (PAM), or any other PM that can be used to control a bias voltage generator. Some embodiments are described using PNM or PDM as examples, but such embodiments can equally employ any other PM.

For a capacitive MEMS device, a diaphragm has a voltage bias applied relative to a back plate. For example, a MEMS motor may not technically be a transducer until the bias is applied. Certain MEMS microphones are sensitive to the ambient pressure and perturbing or unwanted forces can cause deflection of the diaphragm. For example, some MEMS microphones include a vacuum in a chamber and the pressure difference between the vacuum and ambient pressure can cause deflection of the diaphragm of the microphone. As a further example, a change in atmospheric pressure can displace the diaphragm from its desired position. The deflection can affect the sensitivity of the microphone and thereby adversely affect microphone performance in terms of distortion and Signal-to-noise Ratio (SNR).

Embodiments can compensate for deflection of the diaphragm due to perturbing forces. For example, when a diaphragm of a MEMS microphone is deflected due to a change in ambient pressure, the deflection can be compensated by an electrostatic force generated by an electric field between the backplate and the diaphragm of the microphone. The electrostatic force can depend on the bias voltage. Embodiments can provide for a desired operating point in both the physical displacement, such as position, of the diaphragm and the electrical bias voltage. A voltage offset can be applied to the bias voltage to counteract the change in ambient pressure. Digital or analog signals can control this voltage offset.

To elaborate, some MEMS microphones use a servo-loop, such as a feedback control system, where the controlled variable is typically a mechanical position, to compensate for changing ambient pressures to achieve high sensitivity. The negative impact of changes in ambient pressure can be compensated by adjusting the bias voltage on the microphones, which requires an adjustable output voltage of the bias voltage generator. Achieving high voltages with area and power efficient circuits is non-trivial to begin with, and to make the output voltage adjustable complicates the challenge further.

For some MEMS devices, the output voltage needs to be controllable over a wide voltage range, as a high voltage is required for release of the MEMS from the backplate at startup, and a lower voltage is required for correct placement of the MEMS after it is released from the backplate. For example, when a MEMS microphone is turned off, the diaphragm can get pressed against a back plate, and a higher voltage than the normal bias voltage can be used to release the diaphragm from the back plate. Once the diaphragm is released, the bias voltage can return to its normal operating point. In some example MEMS microphones, the output voltage must be controllable with a resolution of approximately 14 bits to achieve optimal placement of the MEMS diaphragm.

Implementations of voltage regulation can depend on the type of feedback used in the servo-loop. If analog feedback is utilized, the regulation may be carried out by an analog loop filter that controls the reference voltage to a Low-Dropout (LDO) voltage regulator, such as a linear regulator that can operate at a very low potential difference between the input and output voltage. If digital feedback is utilized, the feedback can use a 14-bit Digital to Analog Converter (DAC) to create a reference for a LDO regulator.

Embodiments can use PNM as a power and area efficient way of implementing a bias voltage generator with an adjustable output voltage. Some embodiments can circumvent a need for a dedicated DAC when using digital feedback in the servo-loop. Some embodiments can also avoid the implementation of an additional LDO.

As discussed above, there is a vacuum in a chamber in some MEMS microphones. The pressure difference between the vacuum and ambient pressure can cause deflection of the diaphragm of the microphone. The deflection can affect the sensitivity of the microphone and thereby the performance in terms of distortion and SNR. The deflection can be compensated by the electrostatic force generated by the electric field between the backplate and the diaphragm. The electrostatic force can depend on the bias voltage.

FIG. 1 is an example MEMS system 100 according to a possible embodiment. The MEMS system 100 can include a charge pump 110, a MEMS transducer 120, a loop filter 130, and an Analog-to-Digital (ADC) converter 140. The charge pump 110 can be a kind of DC-to-DC converter that uses capacitors for energetic charge storage to raise or lower voltage. The charge pump 110 can provide a bias voltage to the MEMS transducer 120. To compensate for varying ambient pressure, MEMS diaphragm placement can be measured and the bias voltage can be adjusted to compensate for the ambient pressure. To control the bias voltage, a feedback loop can be used. The loop can have a digital or analog feedback. In the case of a digital feedback loop, such as using the ADC 140, of some MEMS transducers, the bias voltage generator, such as the charge pump 110, can require a very high resolution, such as more than 10 bits, on the adjustable output voltage due to the non-linearity of the effect of the bias voltage on the MEMS transducer 120. Furthermore, the control loop of some MEMS microphones may require a bandwidth of at least 1 kHz during start-up, but a bandwidth of only 1 Hz when settled.

Figure 2:
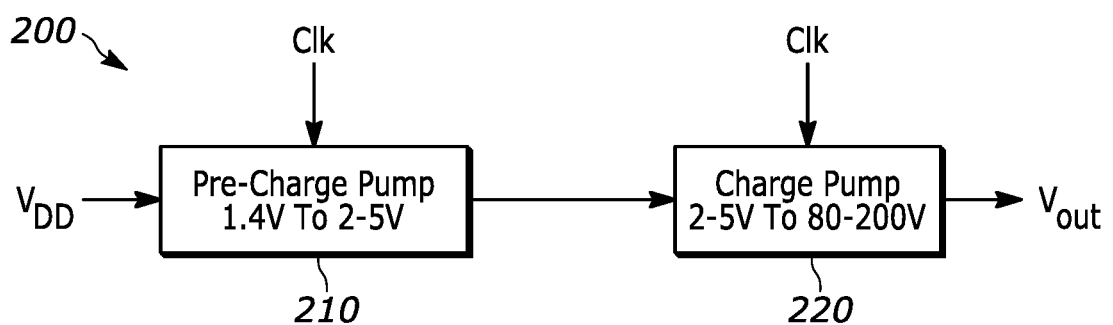
FIG. 2 is an example block diagram of a multistage charge pump according to a possible embodiment.

FIG. 2 is an example block diagram of a multistage charge pump 200 according to a possible embodiment. Referring to different possible embodiments shown in FIGS. 2, 3A, 3B, and 4-8, a multistage charge pump 200, such as cascaded charge pumps, can include a first charge pump 210 and a second charge pump 220. According to a possible embodiment, at least one of the charge pumps 210 and 220 can receive a voltage supply, such as $V_{DD}$. At least one of the charge pumps 210 and 220 can also receive a clock signal, clk. The second charge pump 220 can provide an output voltage, such as $V_{out}$.

Some MEMS microphones can use high bias voltages, such as in the 50-80 V range. Some other MEMS microphones can use a startup voltage of up to 200 V and a voltage of 100-180 V during operation. As discussed above, the startup voltage can be used for release of a diaphragm or other movable element from a backplate. Generating voltages this high from a low supply voltage, such as a 1.4 V, is non-trivial if the circuits should be power and area efficient. One area-efficient implementation can be a cascaded implementation where a first charge pump 210 boosts the supply voltage $V_{DD}$ up to the voltage rating of transistors in the process technology. Then, a second charge pump 220 can use the boosted supply voltage to generate the high output voltage $V_{out}$.

In some embodiments, when charge pumps are used for biasing applications, the load can have a very high impedance. It can be a challenge to design a charge pump that has similar impedance. For example, with MEMS microphones, the impedance of the microphone can be 100 GOhm or more, and a high voltage charge pump implemented with very small capacitors and low switching frequency can feature around a 4 GOhm output impedance. Increasing the charge pump impedance to 100 GOhm by using PNM can require a pulse density of 4% or less, which may result in a switching frequency in the audio band. At least some embodiments can provide for using PNM for biasing applications, which may otherwise be unsuitable due to high load impedances.

Figure 3A:
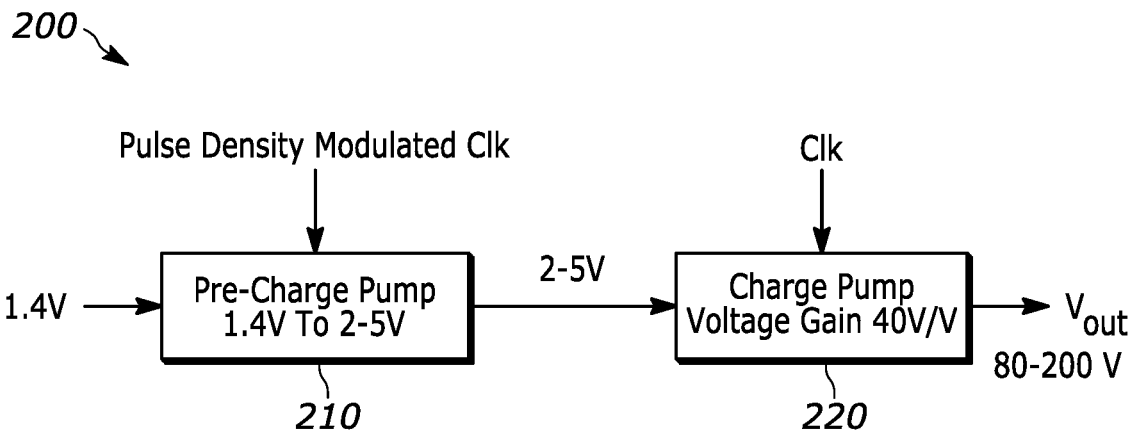
FIG. 3A is an example block diagram of the multistage charge pump according to a possible embodiment.
Figure 3B:
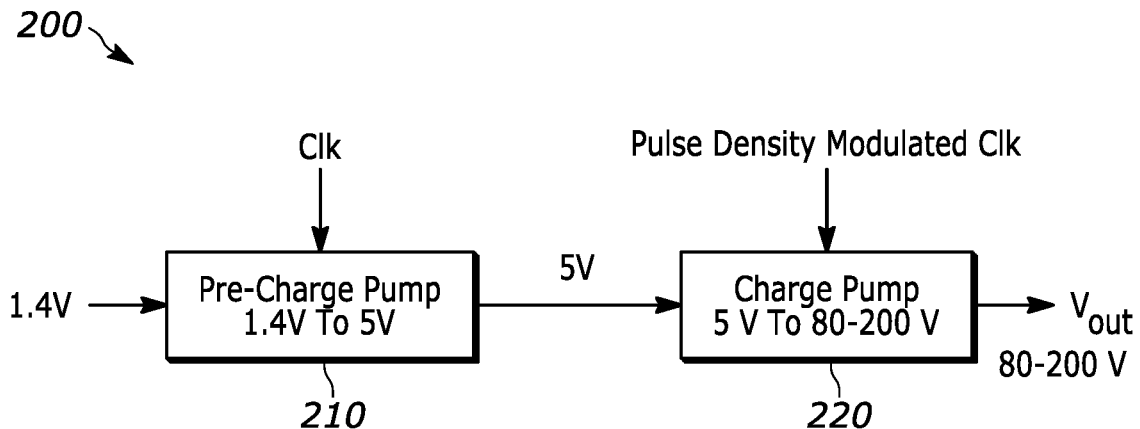
FIG. 3B are an example block diagram of the multistage charge pump according to a possible embodiment.

FIGS. 3A and 3B are example block diagrams of the multistage charge pump 200 according to possible embodiments. At least some embodiments can circumvent a dedicated DAC and LDO for regulating the output voltage of a charge pump. PM, such as PDM, PNM, PWM, PAM, or other PM, and illustrated as PDM, can be used to control the output voltage of the multistage charge pump 200. The PDM can be applied to the first charge pump as shown in FIG. 3A, to the second charge pump as shown in FIG. 3B, or to one or more of any charge pumps in a multistage charge pump that can be cascaded or non-cascaded.

Referring to FIG. 3A, when the second charge pump 220 is connected to a very high impedance load, instead of using PDM on the second charge pump, a possible embodiment can use PDM on the first charge pump 210 that supplies power to the second charge pump 220. Because the power consumption of the high impedance loaded second charge pump 220 can be dominated by switching losses, the second charge pump 220 can pose as a relatively fixed load to the first lower voltage charge pump. The high impedance loaded second charge pump 220 can be modelled as a resistor, such as in the range of 50-5000 kOhm dependent on design. The lower voltage first charge pump 210 can be designed to have an output resistance that is close to the 50-5000 kOhm, where the density, such as frequency of pulses, may not need to be significantly reduced before the output voltage changes significantly, which can allow voltage regulation by PM. Using PM can also avoid an output filter required when using an oversampled DAC, which can save significant area in a system that uses the charge pumps.

To elaborate according to a possible embodiment, a MEMS system can include at least two cascaded charge pumps 200, including a low voltage charge pump 210 and a high voltage charge pump 220. The high voltage charge pump 220 can be loaded by a MEMS with a very high impedance. The low voltage charge pump 210 can, at full number modulation, such as at full pulse density, boost a supply voltage of 1.4 V to 5 V, and the high voltage charge pump 220 can have a fixed voltage gain of 40 V/V, which can boost the 5 V to 200 V. For example, PNM can control the conversion ratio ($V_{out}/V_{in}$) of the low voltage charge pump 210. If the output voltage of the low voltage charge pump 210 is reduced by 0.1 V through PNM, the output voltage of the high voltage charge pump can drop by 4 V to 196 V.

Referring to FIGS. 4-8, a PNM signal generator 450 can be used to generate the PNM signal. The position signal generator 440 can provide a position signal to the PNM signal generator based on a position of a movable element. The position signal generator 440 can be a sensor circuit, can be a capacitor and a capacitance-to-signal converter, can be a capacitive voltage divider and signal chain, can be a sensor that senses a change in capacitance between a diaphragm and a back plate, can an optical sensor, and/or can be any other position signal generator that can generate a signal based on a position of a movable element. For example, the position signal generator 440 can be a sensor circuit coupled to a MEMS motor and configured to generate a feedback signal based on a position of the movable electrode caused by ambient pressure or other forces.

Figure 4:
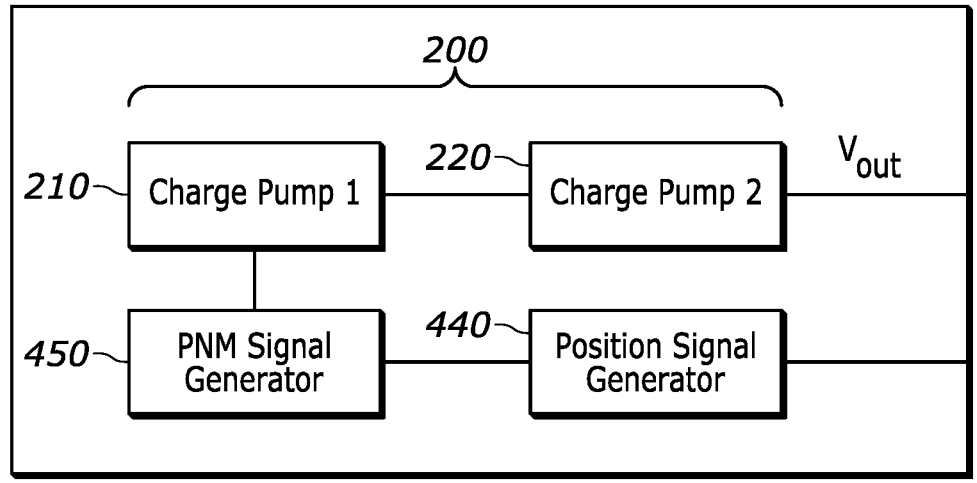
FIG. 4 is an example block diagram of a MEMS transducer interface circuit according to a possible embodiment.

FIG. 4 is an example block diagram of a MEMS transducer interface circuit 400 according to a possible embodiment. The MEMS transducer interface circuit 400 can be connectable to a MEMS transducer (not shown) having a movable element, such as a diaphragm or other movable element that can be controlled with a bias voltage. The circuit 400 can include a PNM signal generator 450 configured to generate a PNM signal based on a position signal representing a position of the movable element.

The circuit 400 can include a multistage charge pump 200. The multistage charge pump 200 can re-position the movable element relative to a reference position by applying a bias voltage to the MEMS transducer based on the reference signal when the MEMS transducer interface circuit is coupled to the MEMS transducer.

The multistage charge pump 200 can include a first charge pump stage 210 coupled to the PNM signal generator 450 and configured to generate a reference signal that varies based on variation of pulses of the PNM signal. The PNM signal generator 450 can be any other PM generator that can generate a reference signal that varies in the frequency of pulses, varies in amplitude of pulses, varies in the density of pulses, varies in a number of pulses over a given period, and/or otherwise varies the pulses. The multistage charge pump 200 can include a second charge pump stage 220 coupled to the first charge pump stage 210. The first charge pump stage 210 can provide the reference signal to the second charge pump stage 220. The second charge pump stage 220 can provide a bias voltage based on the reference signal to the MEMS transducer when the MEMS transducer interface circuit 400 is coupled to the MEMS transducer. For example, the second charge pump stage 220 can provide the bias voltage in the form of a DC output voltage dependent on the reference signal.

According to a possible embodiment, the first charge pump stage 210 can be an upstream charge pump stage having a first output impedance. The second charge pump stage 220 can be a downstream charge pump stage having a second output impedance. The second output impedance can be greater than the first output impedance. The upstream charge pump stage can generate the reference signal based on the PNM signal and can apply the reference signal to the downstream charge pump stage. The downstream charge pump stage can provide the bias voltage to the MEMS transducer when the MEMS transducer interface circuit is coupled to the MEMS transducer.

According to a possible embodiment, the circuit 400 can include a position signal generator 440 that can generate the position signal representing the position of the movable element when the circuit 400 is connected to the MEMS transducer. The PNM signal generator 450 can generate the PNM signal based on the position signal. The PNM signal generator 450 can generate a digital or analog PNM signal. For example, the PNM signal generator 450 can be a sigma-delta modulator, can be a clock divider, can be a voltage-controlled oscillator, or can be any other PNM signal generator.

According to a possible embodiment, the position signal generator 440 can be a capacitance-to-signal converter that generates the position signal based on a capacitance that varies based on the position of the movable element when the circuit 400 is connected to the MEMS transducer. For example, the movable element can be a diaphragm that has a capacitance that varies relative to a back plate of the MEMS transducer. According to another embodiment, a separate capacitor can have a capacitance that varies dependent on the position of the movable element. According to another embodiment, the capacitance can be part of a capacitive voltage divider.

Embodiments can provide for a fully digital loop where at least the position signal generator 440, the PNM signal generator 450, and elements for other embodiments are digital circuits. Embodiments can also use analog elements or a combination of analog and digital elements. According to a possible embodiment, the first charge pump 210 and/or the second charge pump 220 individually, or the combination of both, can generate more than 50V. According to a possible embodiment, the PNM signal generator 450 can be a PDM signal generator that generates a digital or analog PDM signal. According to another possible embodiment, the PNM signal generator 450 can be a PWM signal generator that generates a digital or analog signal. The PNM signal generator 450 can also be any other PM generator. The circuit 400 can also employ other sensors along with or incorporated into the position signal generator 440. For example, the circuit 400 can include, or use a signal from, an overload detector that can detect an overload of a movable element and the PNM signal generator 450 can generate a PNM signal based on a signal from the overload detector to adjust the bias voltage to counteract the overload. As the gain of a circuit using movable element, such as a MEMS transducer, can depend on temperature, the circuit 400 can also include, or use a signal from, a temperature detector, and the PNM signal generator 450 can generate a PNM signal based on a detected temperature signal to adjust the bias voltage.

Figure 5:
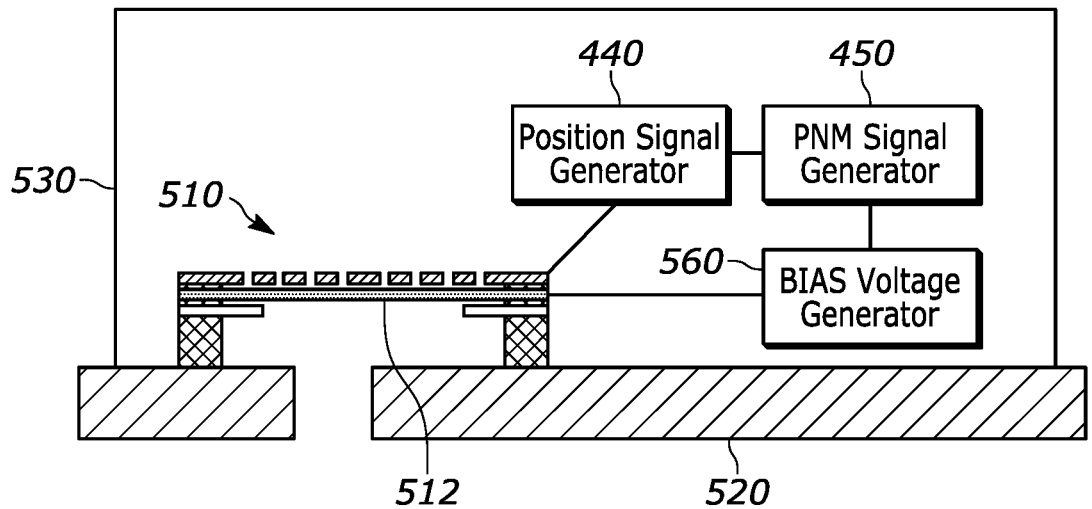
FIG. 5 is an example illustration of an apparatus according to a possible embodiment.

FIG. 5 is an example illustration of an apparatus 500 according to a possible embodiment. The apparatus 500 can incorporate features of the MEMS transducer interface circuit 400, as well as features of other embodiments. The apparatus 500 can include a housing 530. The housing 530 can be the housing of a sensor assembly, a housing of an actuator, or any other housing that can house a MEMS motor. The housing 530 can be a cover mounted to a base 520.

The apparatus 500 can include a MEMS motor 510, such as the MEMS transducer 120, disposed in the housing. The MEMS motor 510 can be capacitive, optical, piezoelectric, and/or any other transduction element. For example, the MEMS motor can be a motor of a microphone, an accelerometer, or other sensor assembly. The MEMS motor can also be a MEMS speaker, a MEMS vibrator, any other actuator. The MEMS motor 510 can include a movable element 512.

The apparatus 500 can include a PNM signal generator 450 that generates a variable PNM signal based on a position of the movable element 512. As with other embodiments, the PNM signal generator 450 can be any other PM generator that generates a variable PM signal. The apparatus 500 can include a bias voltage generator 560. The bias voltage generator 560 can provide a bias voltage to the MEMS motor 510. The bias voltage generator 560 can include a reference signal generator configured to generate a reference signal that varies based on variation of pulses of the PNM signal. The bias voltage can be based on the reference signal. The bias voltage generator 560 can re-position the movable element 512 relative to a reference position based on the reference signal.

The bias voltage generator 560 can be the reference signal generator itself or can include more elements including the reference signal generator. According to a possible embodiment, a reference signal generator can include a linear voltage regulator that generates the reference signal based on the PNM signal. According to another possible embodiment, the bias voltage generator 560 can be a multistage charge pump, where a first stage provides the reference signal to a second stage that provides the bias voltage in the form of a DC output voltage dependent on the reference signal. The bias voltage generator 560 can also be any type of circuit with a variable output voltage, such as a linear regulator.

The PNM signal can be applied to at least one stage of the multistage charge pump.

According to a related embodiment, the bias voltage generator 560, in the form of a multistage charge pump, can include an upstream stage having an output impedance and a downstream stage having an output impedance. The output impedance of the downstream stage can be greater than the output impedance of the upstream stage. The PNM signal generator 450 can be coupled to the upstream stage. The upstream stage can generate the reference signal based on the PNM signal. The upstream stage can apply the reference signal to the downstream stage. The downstream stage can provide the bias voltage to the movable element 512.

According to a possible embodiment, the apparatus 500 can include a position signal generator 440. The position signal generator 440 can generate a position signal representing the position of the movable element 512. The position signal generator 440 can be an ADC, a capacitance-to-signal converter, a capacitive voltage divider coupled to a signal chain, an optical sensor, or other position signal generator that generates a position signal based on the position of the movable element 512. The PNM signal generator 450 can generate the PNM signal based on the position signal.

Figure 6:
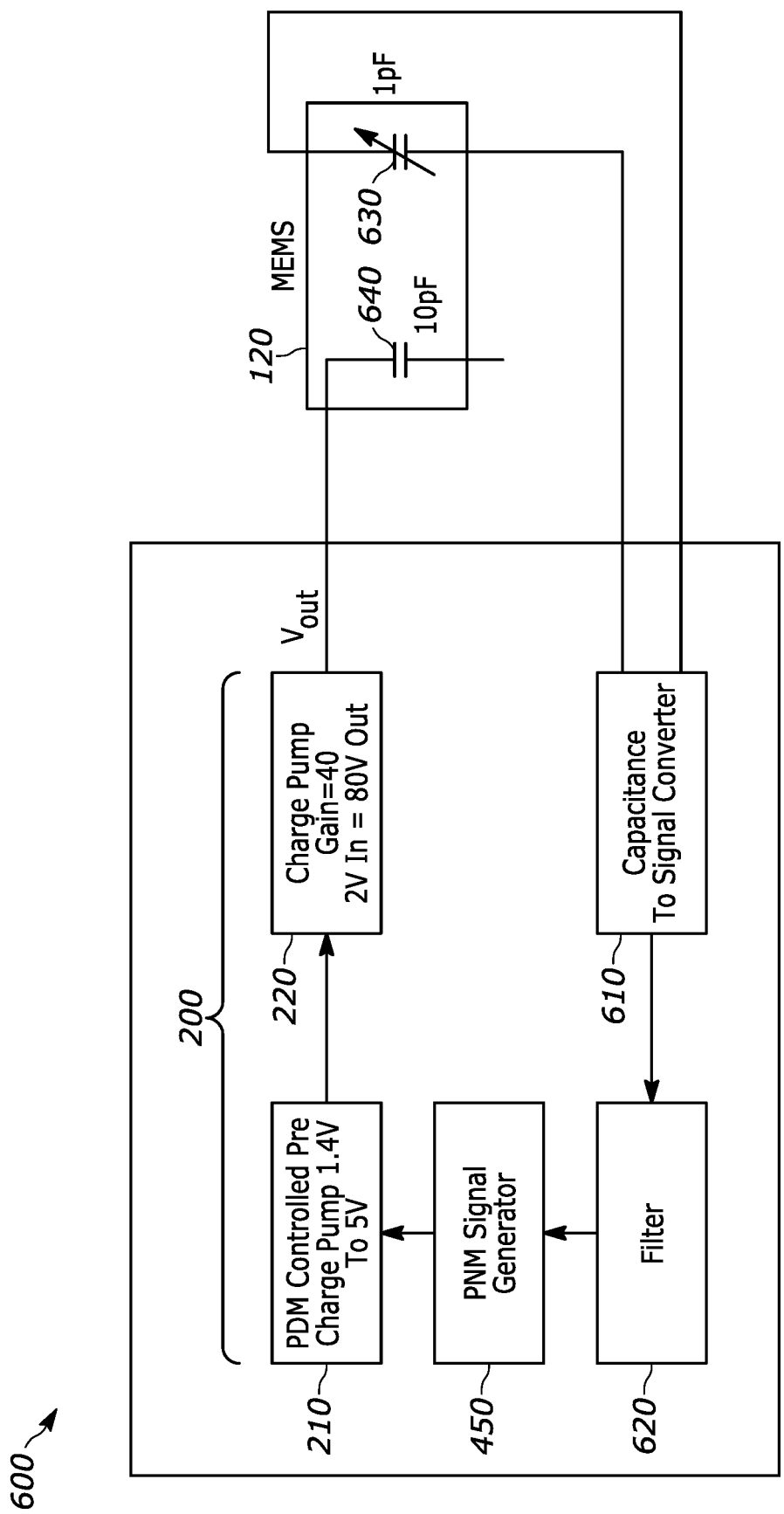
FIG. 6 is an example block diagram of an apparatus according to a possible embodiment.
Figure 7:
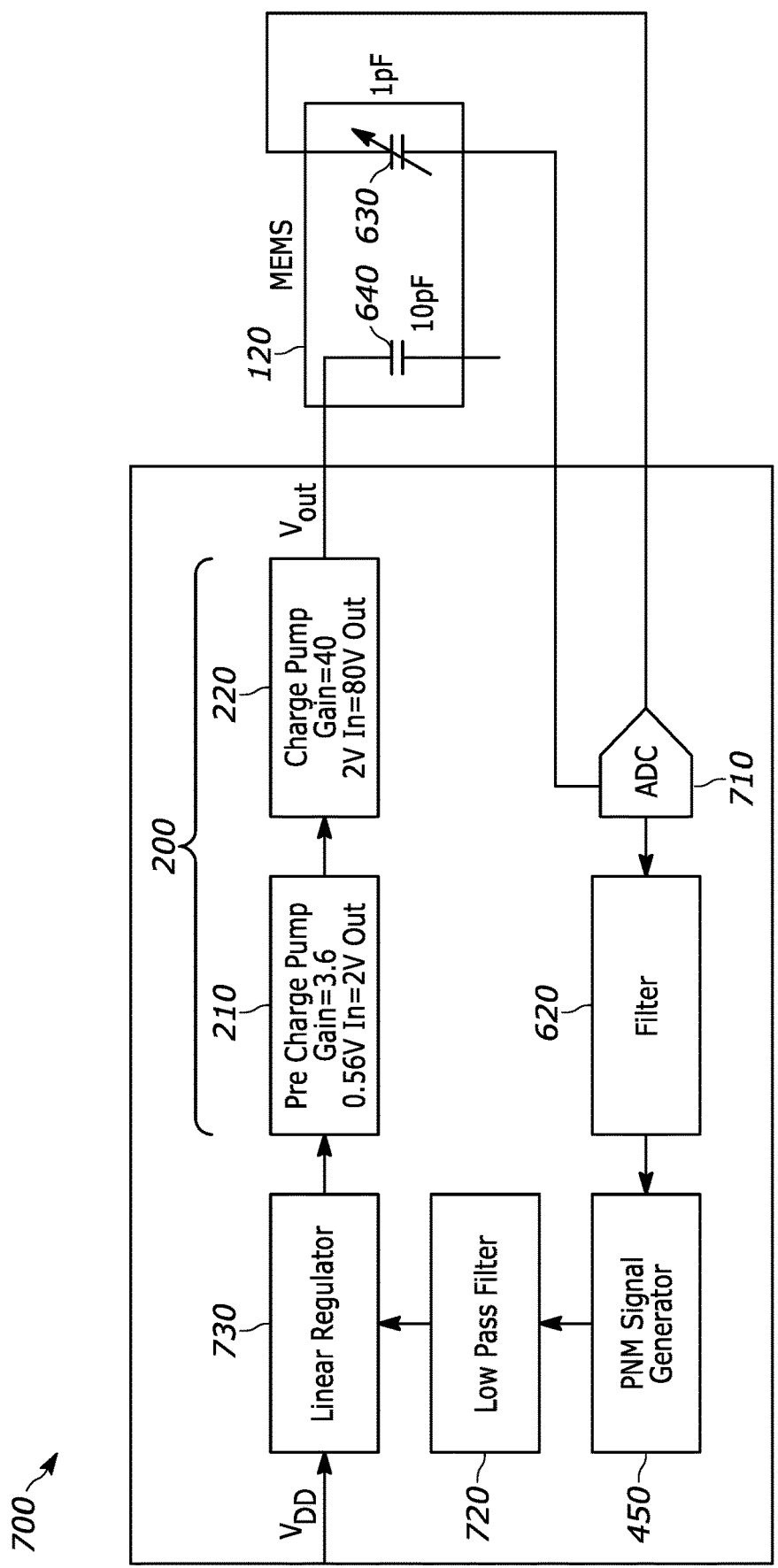
FIG. 7 is an example block diagram of an apparatus according to a possible embodiment.

Referring to the systems 600 and 700 shown in respective FIGS. 6 and 7, a capacitance-to-signal converter 610 can act as a position signal generator. For example, according to a possible embodiment, the capacitance-to-signal converter 610 can be an ADC 710 that generates a digital position signal. The MEMS transducer 120 can have its own capacitance 640, such as between a diaphragm and a backplate. An additional capacitor 630 can be used to detect the position of the diaphragm relative to the backplate. For example, the capacitance of the capacitor 630 can be dependent on the position of the diaphragm. In operation, the capacitance-to-signal converter 610 can convert the capacitance of the capacitor 630 to a position signal that can be current, voltage, charge, digital, or any other signal.

The position signal can be sent to the PNM signal generator 450 via the filter 620. Design of the filter 620 can depend on desired system dynamics. For example, the filter 620 can be a loop filter that sets a transfer function for desired control loop behavior. It can do so by filtering out high frequency noise, but it can also have a more complex behavior, such as band-pass or a non-linear filtering function.

Referring to FIG. 6, the PNM signal generator 450 can generate a PNM signal that is applied to the multistage charge pump 200 including a first charge pump 210 and a second charge pump 220. The multistage charge pump 200 can generate a bias voltage $V_{out}$, as described in previous embodiments.

Referring to FIG. 7, the PNM signal generator 450 can generate a PNM signal, such as a PDM pulse train, where the pulse density depends on the filtered position signal. The PNM signal generator 450 can send the PNM signal to a low pass filter 720. The filter 720 can smooth out a pulse train from the PNM signal generator 450 into a low-frequency voltage. According to other embodiments, the filter 720 can be a band pass filter, a resistor-capacitor filter, any other filter, or may not be necessary when a charge pump of the multistage charge pump 200 provides a sufficient low-pass behavior. The combination of the PNM signal generator 450 and the low pass filter 720, or just the PNM signal generator 450 itself, can be considered a DAC, such as a sigma-delta modulator.

The low pass filter 720 can output the filtered PNM signal as a variable reference signal that depends on the pulse density. The linear regulator 730 can receive the filtered PNM signal and also a supply voltage $V_{DD}$. The filtered PNM signal can set the output voltage of the linear regulator 730. The linear regulator 730 can send a variable supply voltage based on the filtered PNM signal to the multistage charge pump 200 including the first charge pump 210 and the second charge pump 220. According to a possible embodiment for a particular MEMS transducer, the variable supply voltage can be 0.56 V to 1.4 V.

While the output of the linear regulator 730 is shown providing a supply voltage to the first charge pump 210, the linear regulator 730 can also provide the supply voltage to the second charge pump 220, another charge pump, or a combination of charge pumps. According to another possible embodiment, the linear regulator can be located between the first charge pump 210 and the second charge pump 220. According to a possible embodiment, the only inputs to the charge pumps 210 and 220 can be a supply voltage and a clock signal.

The output of the multistage charge pump 200 can be proportional to the supply voltage. For example, by using the PNM signal generator 450 and the linear regulator 730 to vary the supply voltage to the first charge pump 210, the supply voltage for the second charge pump 220 can be varied. Thus, the output voltage for the MEMS transducer can be varied. This linear regulator approach can provide a resolution useful for embodiments that require a high resolution.

Figure 8:
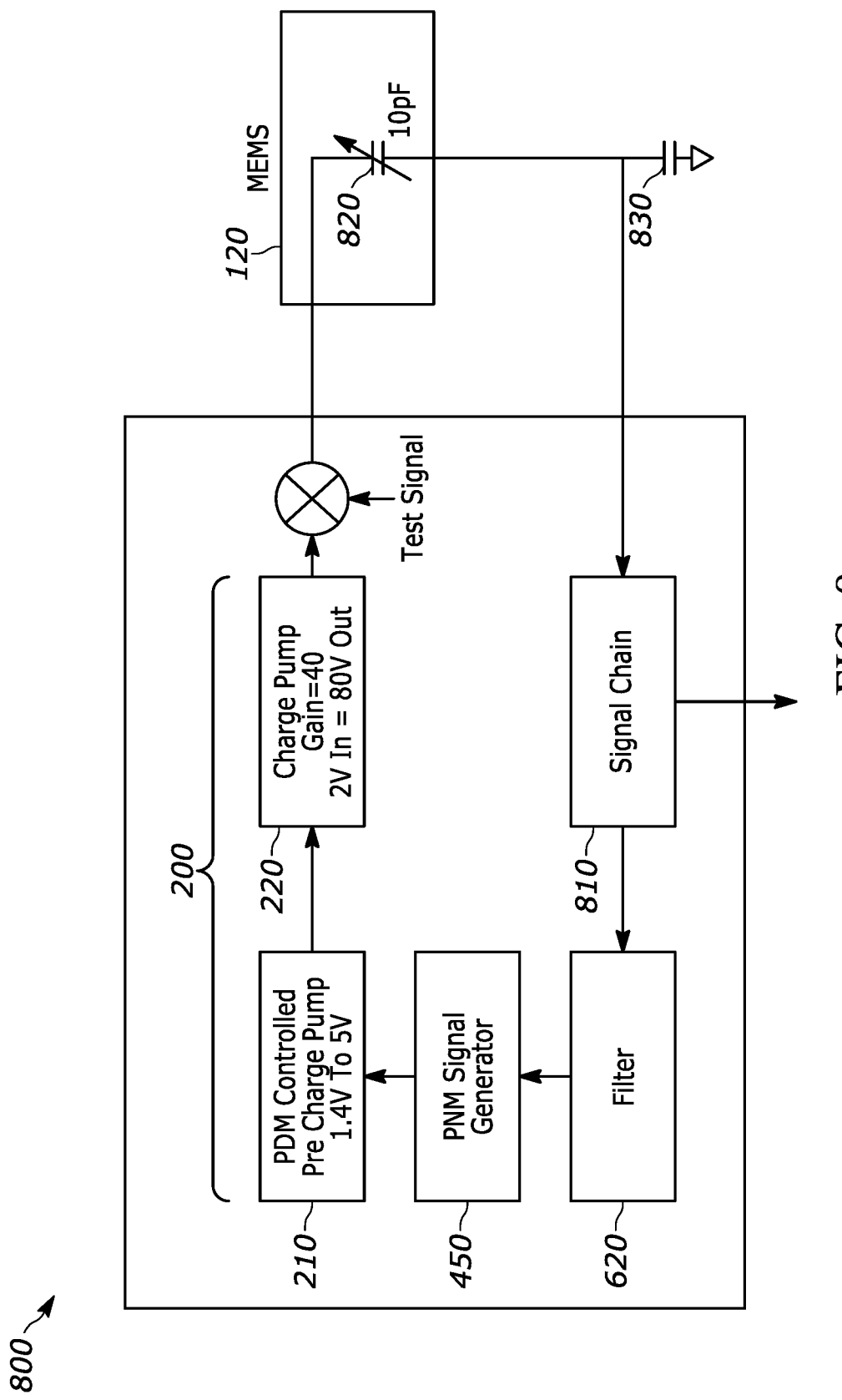
FIG. 8 is an example block diagram of an apparatus according to a possible embodiment.

Referring to the system 800 of FIG. 8 a signal chain 810 can act as a position signal generator. In the present embodiment, the signal chain 810 can also be considered a capacitance-to-signal converter. A diaphragm and a backplate of the MEMS transducer 120 can have a capacitance 820.

When using an AC test signal, the capacitance 820 and an additional capacitance 830 can act as a capacitive voltage divider. The signal chain 810 can interpret the divided voltage as a representation of the displacement of the diaphragm relative to the backplate. The signal chain 810 can then provide the result to the PNM signal generator 450 via a filter 620. The signal chain 810 can also process a signal from the MEMS transducer, such as an audio signal, before it is output to a user. The signal chain 810 can contain amplifiers, an ADC, and/or any other circuitry. The extra capacitor 830 may affect the output signal, but the signal chain can be designed to take the extra capacitance 830 into account and adjust accordingly.

Another embodiment for implementing digital voltage regulation of a bias voltage is to use a dedicated DAC in unison with a linear regulator, such as a LDO voltage regulator. The DAC can be the PNM signal generator or some other DAC. The DAC can receive a digital control signal and can output an analog signal to the LDO. The LDO can receive an input voltage, such as from a voltage supply or an output of a charge pump stage, and can vary its output voltage based on the analog signal from the DAC. The LDO can be inserted before the first charge pump or between later stages of cascaded charge pumps, such as between the first charge pump and the second charge pump. For low-resolution applications this may be a feasible approach, but some applications can require a high resolution on the output, which can increase the requirements to a dedicated DAC. For example, a high-resolution DAC can require a relatively significant area and power for implementation.

Figure 9:
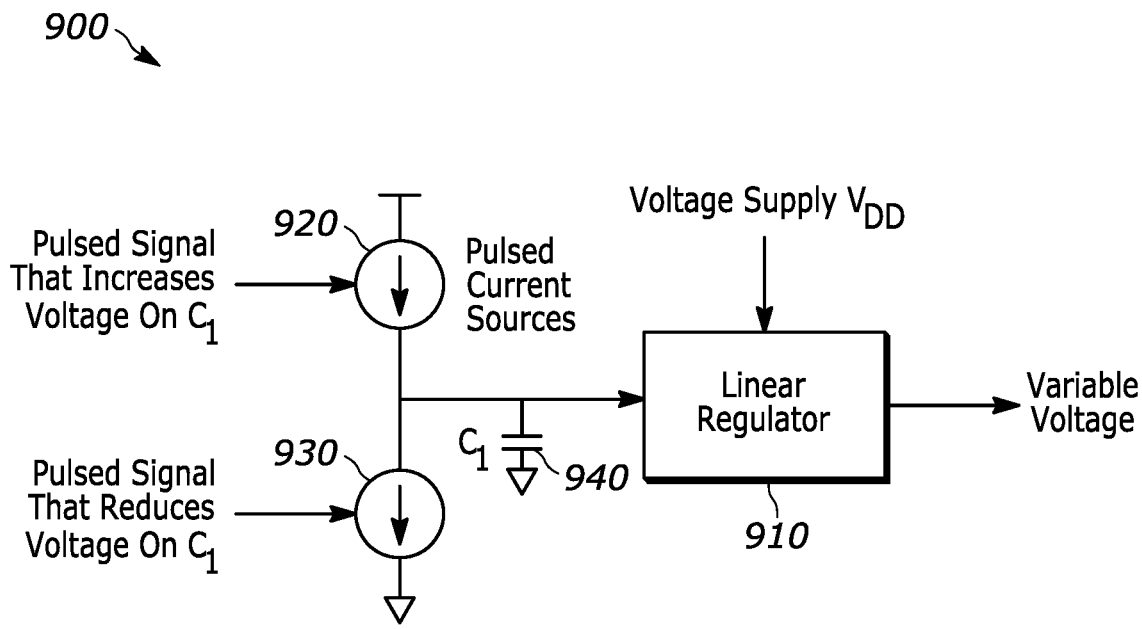
FIG. 9 is an example diagram of a circuit that generates a variable supply voltage based on a Pulse Number Modulation (PNM) signal according to a possible embodiment

FIG. 9 is an example diagram of a circuit 900 that generates a variable supply voltage based on a PNM signal according to a possible embodiment. The circuit 900 can include a linear regulator 910, such as the linear regulator 730. The circuit 900 can also include pulsed current sources 920 and 930 and a capacitor 940. The pulsed current source 920 can receive a pulsed signal that increases a voltage on the capacitor 940. The pulsed current source 930 can receive a pulsed signal that decreases the voltage on the capacitor 940. The pulsed signals can be from at least one PNM signal generator. According to a possible embodiment, separate pulsed signals can be sent to each pulsed current source 920 and 930, which can allow them to be controlled individually. According to another possible embodiment, one pulsed signal can be used for both sources 920 and 930, but one of the sources 920 and 930 can use an inverted version of the pulsed signal.

The voltage on the capacitor 940 can be controlled by pulsed signals. A high number of pulses, such as a high pulse density, can change the voltage quickly. If there are no pulses, the voltage on the capacitor 940 may not change. In other words, the rate of voltage change can be dependent on the pulse density. The capacitor 940 can integrate the output of the sources 920 and 930 to provide a PNM-based voltage to the linear regulator 910. The linear regulator 910 can receive a supply voltage, can receive the voltage on the capacitor 940, and can generate a voltage that varies based on the voltage on the capacitor 940. Thus, the linear regulator 910 can be controlled by PNM.

Figure 10:
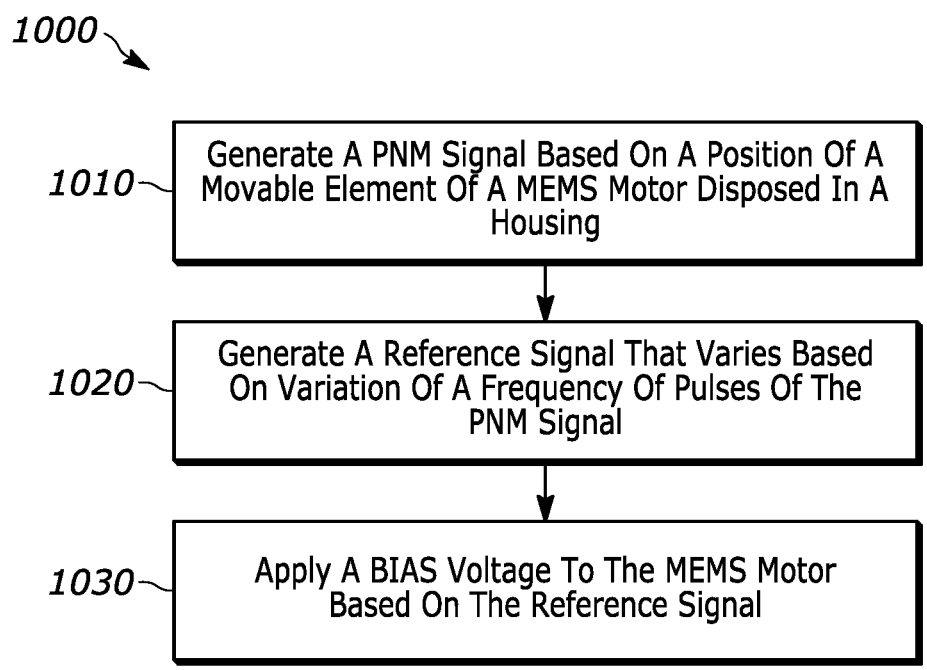
FIG. 10 is an example flowchart illustrating operation of applying a bias voltage to a MEMS device based on a variable reference signal according to a possible embodiment.

FIG. 10 is an example flowchart 1000 illustrating operation of applying a bias voltage to a MEMS device based on a variable reference signal according to a possible embodiment. At 1010, a PNM signal can be generated based on a position of a movable element of a MEMS motor disposed in a housing. The movable element can be a diaphragm, an electrode, an element of a piezoelectric transducer, or any other movable element.

The PNM signal can be provided by a PNM device, such as a Voltage-Controlled Oscillator (VCO), a clock divider, a sigma-delta modulator, a Phase Lock Loop (PLL), or any other way of providing a PNM. Generating the PNM signal can include generating a digital PNM signal. For example, a digital PNM signal can be generated using the mentioned clock divider, PLL, sigma-delta modulator, or any other way of generating a digital PNM signal. Alternatively, an analog PNM signal can be used, such as by using a VCO. In some embodiments, the pulse density of a PNM can be constant, but the number of pulses can vary and some embodiments can generate a reference signal that varies based on the number of pulses. A variation of PNM can include a Pulse Density Modulation (PDM).

Usage of PNM can be dependent on the implementation. According to a possible embodiment, the PNM can always be used. According to another possible embodiment, the PNM can be used only to set a voltage and then can be turned off, such as when no correction is desired. For example, if there are no PNM pulses, there may be no voltage change, and the PNM signal can be turned off, such as when the movable element is in the proper position.

The position can be a position of the movable element relative to non-movable parts of the MEMS motor. According to a possible embodiment the position of the movable element can be a position of a diaphragm relative to a back plate and the location of the diaphragm relative to the back plate can be based on the bias voltage. Position can mean absolute position, can mean location, can mean change in position, such as displacement, and/or can mean any other position. For example, there may be a desired position and barometric/atmospheric pressure, a mechanical shock, an external magnetic field, and/or some other force may move the movable element out of position. In a possible embodiment, change in movable element position attributable to barometric pressure can be differentiated from movable element movement attributable to sound because the change in barometric pressure can have a bandwidth that is less than the audio bandwidth. As another example, a new position of the movable element can be desired instead of a previously desired position. For example, an acoustic overload point of a microphone can be changed by moving the movable element, such as a diaphragm.

According to a possible embodiment, a position signal representing the position of the movable element can be generated. Generating the PNM signal can include generating the PNM signal based on the position signal.

The position signal can be a current, can be a voltage, can be a charge, can be digital, or can be any other signal that corresponds to a position of the movable element. According to a possible embodiment the position signal can be provided by a readout circuit, such as an ADC, a capacitive voltage divider, a capacitance-to-signal converter, or any other readout circuit.

Different methods can be used to detect the position of the movable element. For example, the movable element can be a diaphragm that can change in position relative to a back plate and a change in capacitance between the diaphragm and back plate can indicate the position of the diaphragm. According to another example, the capacitance can be based on a capacitor that is added to the movable element, added to a backplate, or added to another element to detect the position. The capacitor can provide the position signal. The capacitance of the capacitor can be proportional to the distance between the diaphragm and the back plate. According to another example the position can be detected using an optical or other sensor and/or using any other technique of detecting a position of a movable element.

As an alternative to measuring charge on a capacitor, or change therein, the position can also be detected by applying a test signal to the MEMS sensor. The test signal can be a test tone, a sinusoidal wave, a square wave, or other signal and can have a frequency greater than audible frequencies. According to this embodiment, the position of the movable element can be determined based on a measured voltage or current associated with the test signal. The voltage can be measure using a capacitance voltage divider circuit (e.g., a capacitance can exist between the diaphragm and the back plate and an additional capacitor can be added to create a capacitive voltage divider, where the divided voltage can be the position signal representing the position of the diaphragm). Current can be measured across a known resistance or using some other scheme.

As an alternate to using capacitance for the position signal, a difference in output signals between dual diaphragms can be sensed based on intrinsic stress, such as when there are vent holes on each side of dual diaphragms. If ambient pressure changes, capacitance of each of the diaphragms can change and the difference in capacitance can be measured to tell how much diaphragm is displaced.

At 1020, a reference signal can be generated. The reference signal can vary based on variation of pulses of the PNM signal. According to a possible embodiment, variation of pulses can be a variation of the frequency of pulses, which can be a number of pulses in any given time period. Variation of the frequency can reflect a number of pulses in a first time period relative to a number of pulses in second time period. The pulses can also vary in amplitude, number, density, width, or otherwise vary. The first and second time periods can be equal length time periods, can be arbitrary time periods, and/or may or may not overlap. For example, the number of pulses can increase or decrease and the reference signal can change based on a change of the number of pulses of the PNM signal.

According to a possible embodiment, the PNM signal can be provided to an upstream stage of a multistage charge pump to generate the reference signal. The multistage charge pump can be part of an ASIC and can be connected directly to a back plate or diaphragm or otherwise connected to a MEMS device to provide the bias voltage. The reference signal can be applied to a downstream stage of the multistage charge pump. An output impedance of the downstream stage can be greater than an output impedance of the upstream stage. The bias voltage can be applied to the MEMS motor via the downstream stage.

A charge pump can be a circuit that increases an input voltage to a higher voltage. For example, a charge pump can be a DC-to-DC converter that uses capacitors for energetic charge storage to raise the voltage. According to different embodiments, a charge pump can use a switched capacitor DC-DC converter, can use a switched capacitor power converter, or can use other elements for a charge pump.

The multistage charge pump can include a low voltage charge pump and a high voltage charge pump. The multistage charge pump can also include more than two charge pumps and/or multiple charge pumps that provide similar voltage levels. The PNM voltage can be provided to the low voltage charge pump to produce the PNM-based voltage. The PNM-based voltage can be provided from the low voltage charge pump to the high voltage charge pump to generate the bias voltage. Alternatively, the PNM-based voltage can be applied to the high voltage charge pump or to both charge pumps.

According to a possible embodiment, cycle skipping can be used for PNM on the low voltage charge pump. As cycle skipping can otherwise increase ripple in the output voltage, the increased ripple can be filtered by the high voltage charge pump, which can be based on a low pass behavior inherent to charge pumps.

Charge pumps of the multistage charge pump can have an equivalent output impedance/resistance, which can be dependent on the on-resistance of devices used for charge transfer, the capacitance of charge transfer capacitors, and the clock frequency. In the upstream charge pump the stages can typically have a lower output impedance, as they deliver power to the downstream charge pump. The downstream charge pump can drive a capacitive load, which may not require much power. Thus, according to a possible embodiment, a design for a low output impedance in the downstream charge pump may not be necessary.

According to a possible embodiment, the PNM signal can be provided to a linear voltage regulator. The PNM can be provided to the linear voltage regulator via a low-pass filter, via pulsed current sources and a capacitor, and/or otherwise provided to the linear voltage regulator. The linear voltage regulator can generate the reference signal based on the pulse number modulation signal. The linear voltage regulator can then provide a supply voltage for a charge pump. A low voltage charge pump and/or a high voltage charge pump of a multistage charge pump can provide a supply voltage for an upstream and/or downstream charge pump of a multistage charge pump, or provide a supply voltage for any other charge pump. Then, the charge pump can provide the bias voltage. According to another possible embodiment, a linear voltage regulator can provide the bias voltage. According to a possible embodiment, the PNM signal can be provided to pulsed current sources, the output of the pulsed current sources can be integrated by a capacitor, and the integrated output can be the PNM-based voltage provided to the linear regulator.

At 1030, a bias voltage can be applied to the MEMS motor based on the reference signal. The bias voltage can be the reference signal or can be a voltage that is generated based on the reference signal. The reference signal can be a reference voltage, a reference current, or any other reference signal that a bias voltage can be based on. According to a possible embodiment, the movable element can be repositioned relative to a reference position by applying the bias voltage to the MEMS motor based on the position signal.

According to a possible embodiment, the PNM signal can be applied to at least one stage of a multistage charge pump. The bias voltage can be provided from another stage of the multistage charge pump in the form of a DC output voltage dependent on the reference signal. For example, the reference signal can be applied to any one or more stages of the multistage charge pump.

It should be understood that, notwithstanding the particular steps as shown in the figures, a variety of additional or different steps can be performed depending upon the embodiment, and one or more of the particular steps can be rearranged, repeated or eliminated entirely depending upon the embodiment. Also, some of the steps performed can be repeated on an ongoing or continuous basis simultaneously while other steps are performed. Furthermore, different steps can be performed by different elements or in a single element of the disclosed embodiments.

Figure 11A:
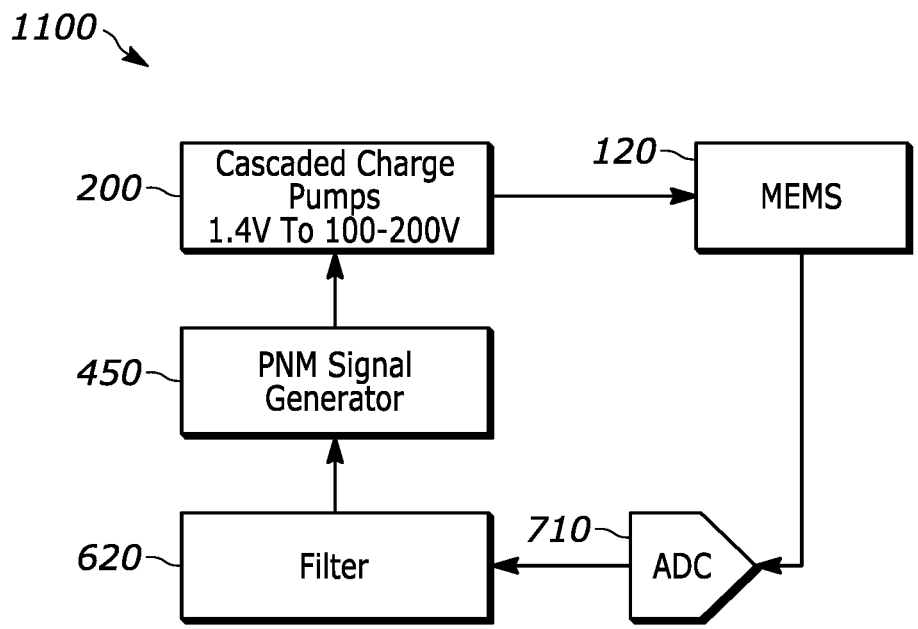
FIG. 11A is an example diagram of a closed-loop system according to a possible embodiment.

FIG. 11A is an example diagram of a closed-loop system 1100 according to a possible embodiment. The closed-loop system 1100 can include the multistage charge pump 200, the MEMS transducer 120, the PNM signal generator 450, the filter 620, and the ADC 710 described in previous embodiments. In the closed-loop system 1100, the filter 620 can be used to achieve a desired loop dynamic, such as by adjusting the system bandwidth and system damping. The filter 620 may be as simple as a low-pass filter, or more complicated, like a non-linear filter.

Figure 11B:
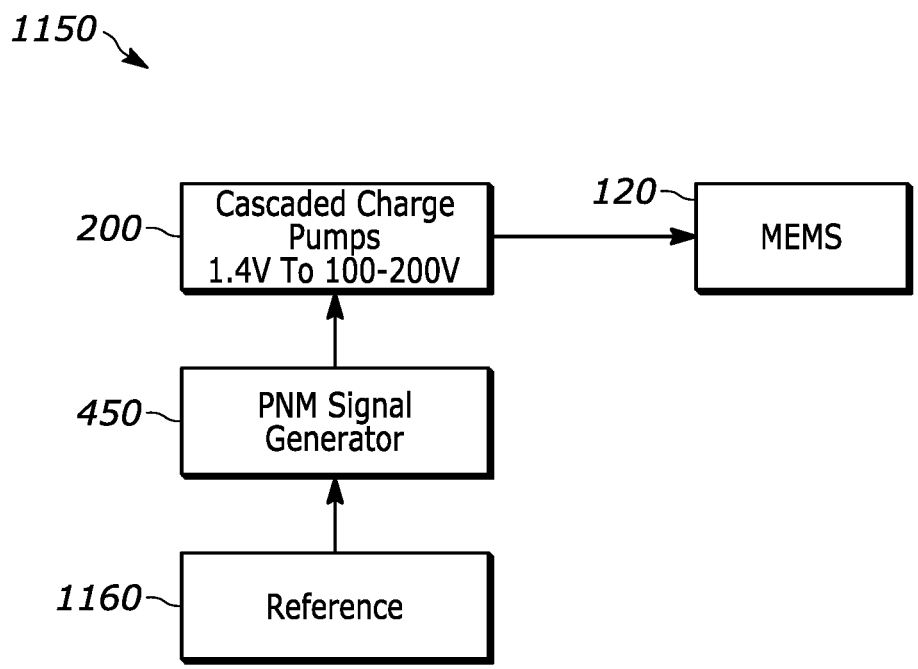
FIG. 11B is an example diagram of an open-loop system according to a possible embodiment.

FIG. 11B is an example diagram of an open-loop system 1150 according to a possible embodiment. The open-loop system 1150 can include the multistage charge pump 200, the MEMS transducer 120, the PNM signal generator 450 described in previous embodiments. The open-loop system can also include a reference 1160. In the open loop application, there can be no feedback about a current position of a movable element, such as a diaphragm of the MEMS transducer 120. The reference 1160 can provide any reference signal that can be used by the PNM signal generator 450 to control the multistage charge pump 200 to adjust a voltage applied to the MEMS transducer 120. For example, using PNM for voltage control may not be limited to feedback loop configurations, but can also be used in open loop configurations.

Figure 12:
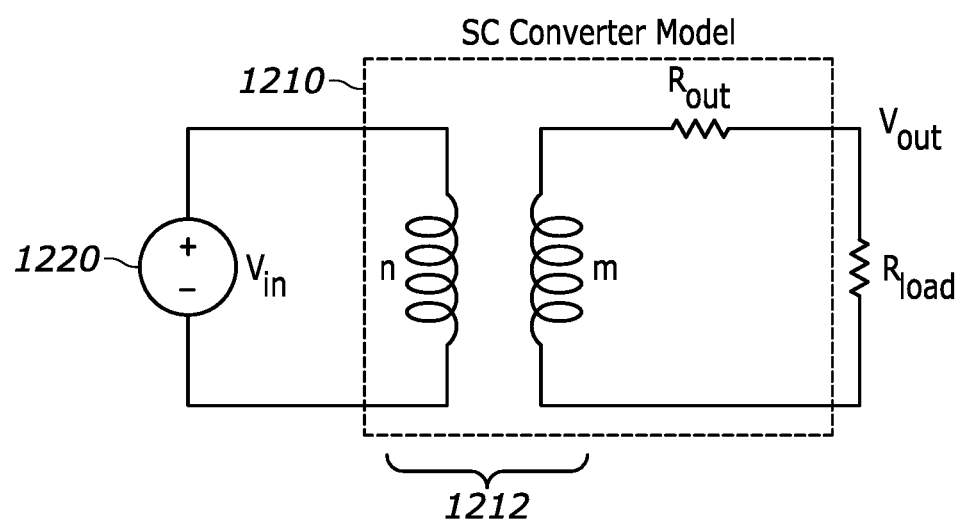
FIG. 12 is an example electrical circuit diagram of a model of a circuit according to a possible embodiment.

FIG. 12 is an example electrical circuit diagram of a model of a circuit 1200 according to a possible embodiment. The circuit 1200 can include a Switched Capacitor (SC) converter model 1210, a voltage source $V_{in}$ 1220, and a load resistance $R_{load}$. The SC converter model 1210 can include a transformer 1212 and an output resistance $R_{out}$. The concept of regulating voltage using PNM can be based on the SC converter model 1210, such as charge pumps. A PNM can control $R_{out}$. If the density/frequency of pulses is increased, $R_{out}$ increases, which decreases $V_{out}$. The $V_{in}$ of second stage can be controlled by controlling $V_{out}$ of first stage, which can be controlled by controlling $R_{out}$ of first stage using PNM. In the model 1210, the transformer 1212 represents the ideal voltage gain of the SC converter and the output resistance $R_{out}$ limits the output voltage due to voltage division with the load resistance $R_{load}$. The output resistance $R_{out}$ can be dependent on the SC converter implementation and the switching frequency of the converter. The output resistance $R_{out}$ can be calculated by:

$$R_{out} = \sqrt{R_{FSL}^2 + R_{SSL}^2}$$

Where $R_{FSL}$ and $R_{SSL}$ are the resistive equivalents of the Fast Switching Limit (FSL), and the Slow Switching Limit (SSL) of the SC converter. $R_{FSL}$ and $R_{SSL}$ are given by:

$$R_{FSL} = \sum_{j=1}^{phases\ switches} \sum_{i=1}^{} \frac{1}{D_j}(a_{j,i}^r)^2 r_i$$

$$R_{SSL} = \sum_{j=1}^{phases\ capacitors} \sum_{i=1}^{} (a_{j,i})^2 \frac{1}{2C_i f_{sw}}$$

The vectors $a_{j,i}^r$ and $a_{j,i}$ describe how charge is transferred by switches and capacitors in the j phases of the converter. $D_j$ is the duty cycle of each phase, $r_i$ is the on-resistance of the switches, $C_i$ is the capacitance of capacitors, and $f_{sw}$ is the switching frequency.

The output voltage of the converter can be adjusted by having a reconfigurable topology with different voltage gains, but to achieve a high resolution on the output, numerous amounts of capacitors and transistors may have to be matched. Instead, adjusting the output resistance $R_{out}$ can be done by adjusting the FSL or SSL component of the converter.

In bias voltage applications, the SSL component can be the dominant component of the output resistance, with the result that the adjustable handles are switched capacitances and the switching frequency. Capacitor banks can be used to control the switched capacitance for low-resolution applications, but for high resolution applications, the switching frequency can be adjustable. In the equation, switching frequency is used for SSL resistance, but the significant component of the switching frequency can be the pulse frequency, such as density. Hence, the output voltage $V_{out}$ can be regulated by controlling the pulse frequency of a clock signal fed to the charge pump. This concept can utilize an array of circuits to control the pulse density, such as VCOs, clock dividers, and sigma-delta modulators.

According to another possible embodiment, a sigma-delta modulator and cycle skipping can be used. For example, instead of regulating the pulse density by controlling the clock frequency using a VCO or clock divider, the amount of clock transitions that is passed from an available system clock source to the charge pump can be used, which is also known as cycle skipping. As discussed above, this can result in an increase of ripple on the output. According to a possible embodiment, to minimize ripple the skipped cycles can be distributed substantially evenly, which can be achieved using a sigma-delta modulator. The sigma-delta modulator can be analog or digital, single-bit or multi-bit, and first or higher order. The chosen modulator can depend on the application and charge pump topology. For a simple charge pump topology in a system with digital feedback, a digitally implemented single-bit sigma-delta modulator can be used, as the modulator output can be used directly as a clock signal for the charge pump.

When using a sigma-delta modulator, the system can handle input signals of varying bandwidths. At higher bandwidths the oversampling ratio can be lower and the quantization noise higher, and at low frequencies the quantization noise can be extremely low, even for a first order single-bit modulator. By using higher order sigma-delta modulators, the noise transfer function of the sigma-delta modulator can be further shaped. The bandwidth and signal to noise ratio may depend on low-pass filtering of the charge pump output. For example, an output filter can be coupled to the output of the charge pump.

In some MEMS transducer systems that use digital feedback, a digital first-order single bit modulator can save both area and power compared to an implementation of a high-resolution DAC and a LDO regulator. Furthermore, in a system of cascaded charge pumps, cycle skipping can be used on the low voltage charge pump. Any increased ripple from cycle skipping can be filtered by the high voltage charge pump, such as by a low pass behavior inherent to charge pumps.

In the context of some MEMS applications, where the high voltage output is ultra-high impedance, the high voltage charge pump can have a load-independent power consumption, which can make open-loop control possible. In other instances, the system can use feedback for accurate control.

Figure 13:
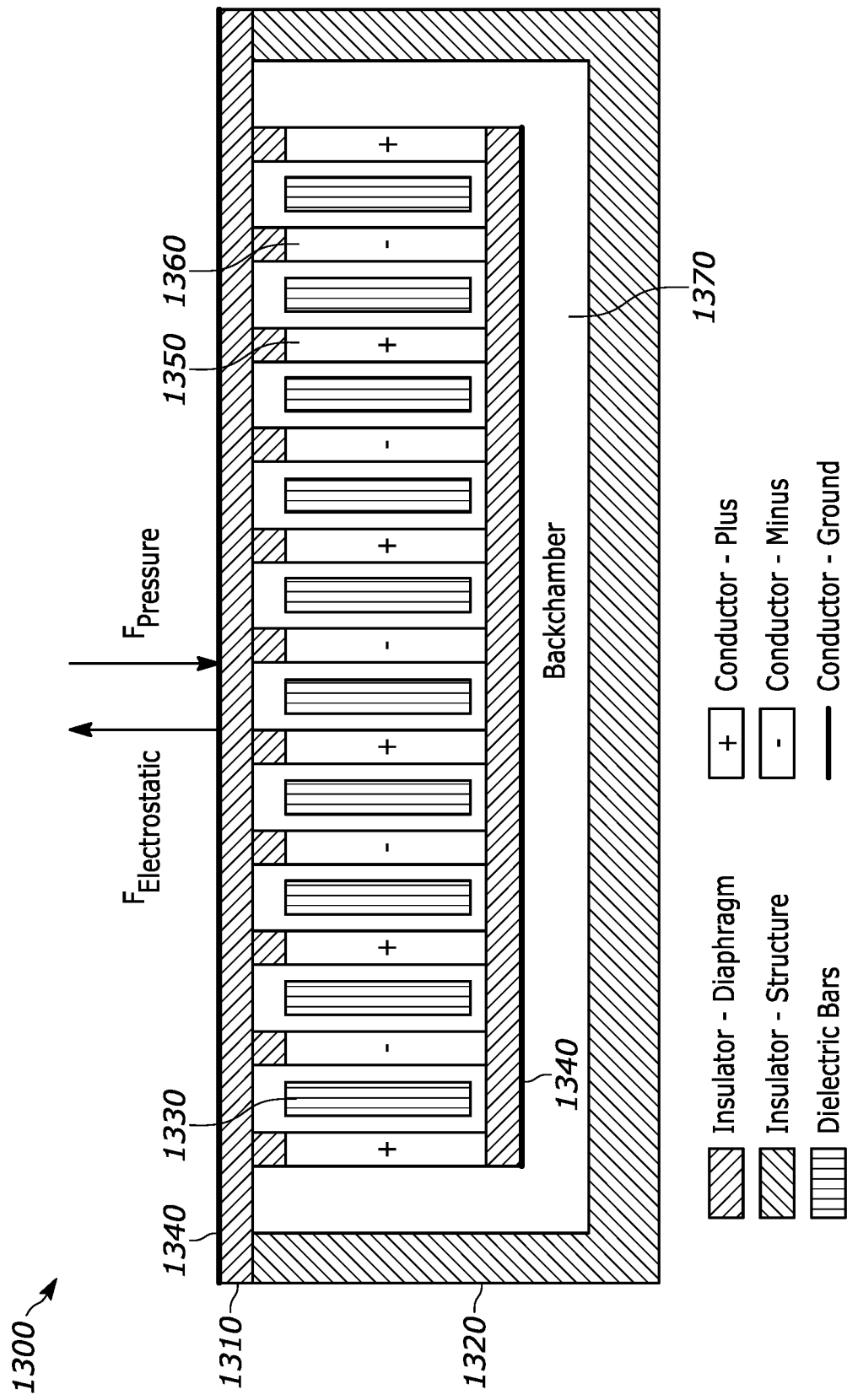
FIG. 13 is an example illustration of a diaphragm assembly according to a possible embodiment.

FIG. 13 is an example illustration of a diaphragm assembly 1300 according to a possible embodiment. The diaphragm assembly 1300 can include insulator material 1310 for the diaphragm, insulator material 1320 for the structure, dielectric bars 1330, conductors 1340, at least one first conductor 1350, and at least one second conductor 1360.

To achieve a high sensitivity, some MEMS devices can have a high compliance diaphragm. This can result in the diaphragm collapsing when MEMS device is powered off.

When the MEMS device is powered on, electrostatic forces $F_{Electrostatic}$ can be used to compensate the force exerted by the pressure difference of a vacuum in the back chamber 1370 and the ambient pressure $F_{Pressure}$. According to a possible embodiment, the second conductor 1360 can be kept at a voltage potential of zero and the first conductor 1350 can be biased with a non-zero voltage, such as a relatively high voltage. This can create the electrostatic force $F_{Electrostatic}$ between the dielectric bars 1330 and the conductors 1350 and 1360. With a large enough bias voltage, the generated electrostatic force $F_{Electrostatic}$ can cancel out the force caused by the pressure difference. The structure of the dielectric bars 1330 and the conductors 1350 and 1360 is sometimes called a comb-drive, such as in the field of MEMS devices. Balancing the pressure induced force $F_{Pressure}$ and the generated electrostatic force $F_{Electrostatic}$ can result in a compliant diaphragm with a high acoustic sensitivity.

According to a possible embodiment, a portion of the conductors 1350 and 1360 can be connected to each other separately from other conductors 1350 and 1360 to create a position sensing capacitor, such as the additional capacitor 630 in the system 600, which can be used to detect the position of a diaphragm relative to a backplate. For example, every eleventh positive conductor 1350 can be connected to each other and every eleventh negative conductor 1360 can be connected to each other. The remaining other positive and negative conductors can be respectively connected. This can result in a large capacitance of 10 pF and a small sensing capacitance of 1 pF that can be used to sense the position of the diaphragm relative to the back plate.

Figure 14:
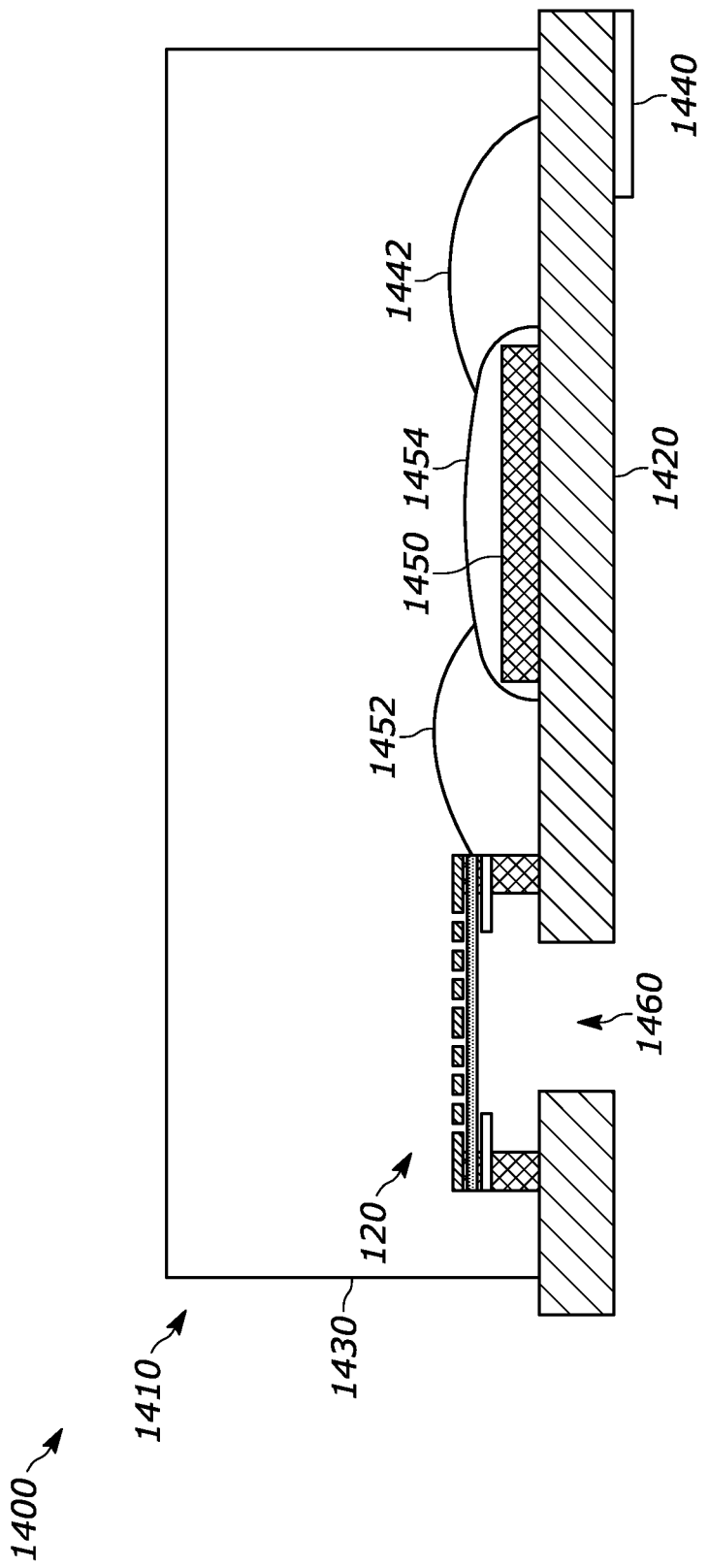
FIG. 14 is an example cross-section view of a sensor package according to a possible embodiment.

FIG. 14 is an example cross-section view of a sensor package 1400 according to a possible embodiment. The sensor package 1400 can include an enclosure 1410 that can include a base 1420 and a cover 1430, such as a can or any other cover, coupled to the base 1412. The MEMS transducer 120 can be located within the enclosure 1410. For example, the enclosure 1410 can enclose the MEMS transducer 120 between the cover 1430 and the base 1420. The sensor package 1400 can include an external-device interface 1440 disposed on the base 1420. The external-device interface 1440 can be implemented as a surface-mount interface or can include leads configured for through-hole mounting on a host device.

The sensor package 1400 can include an integrated circuit 1450, such as an Application Specific Integrated Circuit (ASIC) electrically coupled to the MEMS transducer 120. The integrated circuit 1450 can also be coupled to contacts of the external-device interface 1440, such as via an electrical lead 1442 and/or leads running through the base 1420. The integrated circuit 1450 can include the previously described multistage charge pump 200, position signal generator 440, PNM signal generator 450, bias voltage generator 560, and/or any other circuitry described above. Alternatively, some circuitry can be separate from the integrated circuit 1450.

According to a possible embodiment, the integrated circuit 1450 can receive an electrical signal from the MEMS transducer 120, such as via an electrical lead 1452, and can communicate, such as via the electrical lead 1442 and/or leads in the base 1420, with a host device by using the contacts of the external device interface 1440. According to a possible implementation, the integrated circuit 1450 can be covered by a protective coating 1454.

According to a possible embodiment, the base 1420 can include a sound port 1460. The MEMS transducer 120 can be acoustically coupled to the sound port 1460. For example, the sound port 1460 can be an aperture in the base 1420 that allows sound to pass through the base to the MEMS transducer 120. Illustrated embodiments can be considered a bottom port embodiment, but the sound port 1460 can be located at other locations on the sensor package 1400. For example, the sound port 1460 can also be on the cover 1430 for a top-port transducer assembly. The sound port 1460 can further be on a side of the sensor package 1400, the sound port 1460 can be anywhere else on the sensor package 1400, or there can be no sound port 1460, such as for a MEMS die vibration sensor, vibrator, or other device. According to a possible embodiment, when the MEMS transducer 120 can be acoustically coupled to the sound port 1460 to generate or receive sound. According to other embodiments, the MEMS transducer 120 may not be used in a sensor package, such as when the MEMS transducer 120 is an actuator or vibrator.

The integrated circuit 1450 can implement any operating system, such as Microsoft Windows®, UNIX®, LINUX®, Android™, or any other operating system. Apparatus operation software may be written in any programming language, such as C, C++, Java, or Visual Basic, for example. Apparatus software may also run on an application framework, such as, for example, a Java® framework, a .NET® framework, or any other application framework. The software and/or the operating system can be stored in a memory on the integrated circuit 1450, elsewhere on the MEMS system 100, in cloud storage, and/or anywhere else that can store software and/or an operating system. For example, coding for operations can be implemented as firmware programmed into ROM. The MEMS system 100 or the integrated circuit 1450 can also use hardware to implement disclosed operations. For example, the integrated circuit 1450 can be any programmable processor. Furthermore, the integrated circuit 1450 can perform some or all of the disclosed operations. For example, at least some operations can be performed using cloud computing and the integrated circuit 1450 may perform other operations. At least some operations can also be performed computer executable instructions executed by at least one computer processor. Disclosed embodiments may also be implemented on a general-purpose or a special purpose computer, a programmed microprocessor or microprocessor, peripheral integrated circuit elements, an application-specific integrated circuit or other integrated circuits, hardware/electronic logic circuits, such as a discrete element circuit, a programmable logic device, such as a programmable logic array, field programmable gate-array, or the like. In general, the integrated circuit 1450 may be any controller or processor device or devices capable of operating an apparatus and implementing the disclosed embodiments. Some or all of the additional elements of the integrated circuit 1450 can also perform some or all of the operations of the disclosed embodiments.

At least some embodiments can provide an effective implementation of a PM-controlled bias voltage generator that uses reduced power and occupies a small area. The PM-controlled bias voltage generator can be adapted depending on the environment. For example, the PM-controlled bias voltage generator can provide for fast settling after an overload, changing atmospheric pressure, change in temperature, and/or fast settling after any other event. The PM-controlled bias voltage generator can have a large dynamic range, can have low noise, and/or can have an ability to handle large signals, such as atmospheric pressure changes, a pressure spike due to a slammed door, and/or other large signals. The PM-controlled bias voltage generator can also generate enough force to compensate for the atmospheric pressure. The PM-controlled bias voltage generator can be implemented using a digital servo loop where the displacement of the sensor is converted to a sampled digital value. The PM-controlled bias voltage generator can also use a purely or partial analog implementation. At least some embodiments can provide an implementation of a PM-controlled bias voltage generator with a displacement sensor, ADC, digital loop filter, PNM modulator, and charge pump can implement loop control of a bias voltage.

At least some methods of this disclosure can be implemented on a programmed processor. However, the circuitry, flowchart, and modules may also be implemented on a general purpose or special purpose computer, a programmed microprocessor or microcontroller and peripheral integrated circuit elements, an integrated circuit, a hardware electronic or logic circuit such as a discrete element circuit, a programmable logic device, software, firmware, or the like. In general, any device on which resides a finite state machine capable of implementing the flowcharts shown in the figures may be used to implement the processor functions of this disclosure.

Also, while this disclosure has been described with specific embodiments thereof, it is evident that many alternatives, modifications, and variations will be apparent to those skilled in the art. For example, various components of the embodiments may be interchanged, added, or substituted in the other embodiments. Also, all of the elements of each figure are not necessary for operation of the disclosed embodiments. For example, one of ordinary skill in the art of the disclosed embodiments would be enabled to make and use the teachings of the disclosure by simply employing the elements of the independent claims. Accordingly, embodiments of the disclosure as set forth herein are intended to be illustrative, not limiting. Various changes may be made without departing from the spirit and scope of the disclosure.

In this document, relational terms such as "first," "second," and the like may be used solely to distinguish one entity or action from another entity or action without necessarily requiring or implying any actual such relationship or order between such entities or actions. The phrase "at least one of," "at least one selected from the group of," or "at least one selected from" followed by a list is defined to mean one, some, or all, but not necessarily all of, the elements in the list. The terms "comprises," "comprising," "including," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a," "an," or the like does not, without more constraints, preclude the existence of additional identical elements in the process, method, article, or apparatus that comprises the element. Also, the term "another" is defined as at least a second or more. The terms "including," "having," and the like, as used herein, are defined as "comprising." Furthermore, the background section is not admitted as prior art, is written as the inventor's own understanding of the context of some embodiments at the time of filing, and includes the inventor's own recognition of any problems with existing technologies and/or problems experienced in the inventor's own work.

I claim:

1. An apparatus comprising:
   a housing;
   a microelectromechanical systems (MEMS) motor disposed in the housing, the MEMS motor including a movable element;
   a pulse modulation signal generator that generates a variable pulse modulation signal based on a position of the movable element;
   a bias voltage generator coupled to the MEMS motor and to the pulse modulation signal generator, where the bias voltage generator provides a bias voltage to the MEMS motor, the bias voltage generator including a reference signal generator configured to generate a reference signal that varies based on variation of pulses of the pulse modulation signal,
   wherein the bias voltage is based on the reference signal.

2. The apparatus according to claim 1, further comprising a position signal generator that generates a position signal representing the position of the movable element, wherein the pulse modulation signal generator generates the pulse modulation signal based on the position signal.

3. The apparatus according to claim 1, wherein the bias voltage generator re-positions the movable element relative to a reference position based on the reference signal.

4. The apparatus according to claim 1,
   wherein the bias voltage generator comprises a multistage charge pump that provides the bias voltage in the form of a DC output voltage dependent on the reference signal, and
   wherein the pulse modulation signal is applied to at least one stage of the multistage charge pump.

5. The apparatus according to claim 1,
   wherein the bias voltage generator comprises a multistage charge pump including an upstream stage having an output impedance and a downstream stage having an output impedance, where the output impedance of the downstream stage is greater than the output impedance of the upstream stage,
   wherein the pulse modulation signal generator is coupled to the upstream stage, where the upstream stage generates the reference signal based on the pulse modulation signal,
   wherein the upstream stage applies the reference signal to the downstream stage, and
   wherein the downstream stage provides the bias voltage to the movable element.

6. The apparatus according to claim 1, wherein the reference signal generator comprises a linear voltage regulator that generates the reference signal based on the pulse modulation signal.

7. A method comprising:
   generating a pulse modulation signal based on a position of a movable element of a microelectromechanical systems (MEMS) motor disposed in a housing;
   generating a reference signal that varies based on variation of pulses of the pulse modulation signal; and
   applying a bias voltage to the MEMS motor based on the reference signal.

8. The method according to claim 7, further comprising generating a position signal representing the position of the movable element, wherein generating the pulse modulation signal comprises generating the pulse modulation signal based on the position signal.

9. The method according to claim 7, further comprising re-positioning the movable element relative to a reference position by applying a bias voltage to the MEMS motor based on the position signal.

10. The method according to claim 7, further comprising:
    applying the pulse modulation signal to at least one stage of a multistage charge pump; and providing the bias voltage from another stage of the multistage charge pump in the form of a DC output voltage dependent on the reference signal.

11. The method according to claim 7, further comprising:
providing the pulse modulation signal to an upstream stage of a multistage charge pump to generate the reference signal;
applying the reference signal to a downstream stage of the multistage charge pump, wherein an output impedance of the downstream stage is greater than an output impedance of the upstream stage; and
applying the bias voltage to the MEMS motor via the downstream stage.

12. The method according to claim 7, further comprising providing the pulse modulation signal to a linear voltage regulator,
wherein generating the reference signal comprises generating, using the linear voltage regulator, the reference signal based on the pulse modulation signal.

13. A microelectromechanical systems (MEMS) transducer interface circuit connectable to a MEMS transducer having a movable element, the MEMS transducer interface circuit comprising:
a pulse modulation signal generator configured to generate a pulse modulation signal based on a position signal representing a position of the movable element; and
a multistage charge pump comprising:
a first charge pump stage coupled to the pulse modulation signal generator and configured to generate a reference signal that varies based on variation of pulses of the pulse modulation signal; and
a second charge pump stage coupled to the first charge pump stage, wherein the second charge pump stage provides a bias voltage, based on the reference signal, to the MEMS transducer when the MEMS transducer interface circuit is coupled to the MEMS transducer.

14. The MEMS transducer interface circuit according to claim 13, wherein the first charge pump stage provides the reference signal to the second charge pump stage.

15. The MEMS transducer interface circuit according to claim 13, further comprising a position signal generator coupled to the pulse modulation signal generator and configured to generate the position signal representing the position of the movable element when the MEMS transducer interface circuit is connected to the MEMS transducer, wherein the pulse modulation signal generator generates the pulse modulation signal based on the position signal.

16. The MEMS transducer interface circuit according to claim 13, further comprising a capacitance-to-signal converter that generates the position signal based on a capacitance that varies based on the position of the movable element when the MEMS transducer interface circuit is connected to the MEMS transducer.

17. The MEMS transducer interface circuit according to claim 13, wherein the pulse modulation signal generator generates a digital pulse modulation signal.

18. The MEMS transducer interface circuit according to claim 13, wherein the multistage charge pump provides the bias voltage in the form of a DC output voltage dependent on the reference signal.

19. The MEMS transducer interface circuit according to claim 13,
wherein the first charge pump stage comprises an upstream charge pump stage having a first output impedance,
wherein the second charge pump stage comprises a downstream charge pump stage having a second output impedance, where the second output impedance is greater than the first output impedance,
wherein the pulse modulation signal generator is coupled to the upstream charge pump stage, where the upstream charge pump stage generates the reference signal based on the pulse modulation signal,
wherein the upstream charge pump stage applies the reference signal to the downstream charge pump stage, and
wherein the downstream charge pump stage provides the bias voltage to the MEMS transducer when the MEMS transducer interface circuit is coupled to the MEMS transducer.

20. The MEMS transducer interface circuit according to claim 13, wherein the multistage charge pump re-positions the movable element relative to a reference position by applying a bias voltage to the MEMS transducer based on the reference signal when the MEMS transducer interface circuit is coupled to the MEMS transducer.

* * * * *